(12) United States Patent
Poess et al.

(10) Patent No.: US 11,099,758 B2
(45) Date of Patent: Aug. 24, 2021

(54) MEMORY MANAGEMENT OF COMPUTING DEVICES

(71) Applicant: Facebook Technologies, LLC, Menlo Park, CA (US)

(72) Inventors: Bernhard Poess, Redmond, WA (US); Vadim Victor Spivak, Redwood City, CA (US); Christoph Klee, Snoqualmie, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 72 days.

(21) Appl. No.: 16/513,134

(22) Filed: Jul. 16, 2019

(65) Prior Publication Data

US 2021/0019068 A1    Jan. 21, 2021

(51) Int. Cl.
*G06F 3/06* (2006.01)
*G06F 16/16* (2019.01)
(Continued)

(52) U.S. Cl.
CPC .......... *G06F 3/0643* (2013.01); *G06F 3/0604* (2013.01); *G06F 3/0608* (2013.01);
(Continued)

(58) Field of Classification Search
CPC ............. G06F 16/1737; G06F 12/0246; G06F 9/4843; G11C 7/22
See application file for complete search history.

(56) References Cited

U.S. PATENT DOCUMENTS 5,928,365 A     7/1999  Yoshida
6,298,422 B1 * 10/2001  Spilo ..................... G06F 9/4843
                                                          711/151
(Continued)

FOREIGN PATENT DOCUMENTS

WO      WO2017050028 A1 *  3/2017  ......... G06F 12/0246

OTHER PUBLICATIONS

International Search Report and Written Opinion for International Application No. PCT/US2020/041513, dated Oct. 21, 2020.

*Primary Examiner* — Adam M Queler
*Assistant Examiner* — Trang K Ta
(74) *Attorney, Agent, or Firm* — Baker Botts L.L.P.

(57) ABSTRACT

In one embodiment, a method includes allocating, by an operating system of a computing device, computer-implemented memory into a discardable portion and a durable portion; receiving, from a computer-executable program, a designation indicator of a particular data file that is associated with the computer-executable program indicating that the particular file is to be stored in the discardable portion of the memory and in response, storing the particular data file in one or more particular pages of the discardable portion of the memory; identifying an occurrence of a computing condition and in response, marking the one or more particular pages that include the particular data file as invalid for the computer-executable program; receiving, from the computer-executable program, a request for the particular data file; and in response to receiving the request, providing, to the computer-executable program, a notification that the particular data file is invalid for the computer-executable program.

15 Claims, 3 Drawing Sheets

(51) Int. Cl.
*G06T 19/00* (2011.01)
*G11C 7/10* (2006.01)

(52) U.S. Cl.
CPC .......... *G06F 3/0652* (2013.01); *G06F 3/0673* (2013.01); *G06F 16/162* (2019.01); *G06T 19/00* (2013.01); *G11C 7/1006* (2013.01)

(56) References Cited

U.S. PATENT DOCUMENTS

| | | | |
|---|---|---|---|
| 2004/0044873 A1* | 3/2004 | Wong | G06F 12/0246 711/218 |
| 2006/0184719 A1* | 8/2006 | Sinclair | G06F 12/0246 711/103 |
| 2006/0236026 A1* | 10/2006 | Hempel | G06Q 20/341 711/103 |
| 2010/0228795 A1 | 9/2010 | Hahn | |
| 2011/0283071 A1* | 11/2011 | Yokoya | G06F 12/023 711/162 |
| 2012/0047154 A1* | 2/2012 | Lin | G06F 16/1737 707/756 |
| 2012/0151124 A1* | 6/2012 | Baek | G06F 12/0246 711/103 |
| 2014/0047251 A1* | 2/2014 | Kottilingal | G06F 12/08 713/320 |
| 2018/0067539 A1* | 3/2018 | Samson | G06F 1/3296 |
| 2018/0173620 A1* | 6/2018 | Cen | G06F 3/064 |
| 2018/0335968 A1* | 11/2018 | Pauley | G06F 11/3034 |
| 2021/0089444 A1* | 3/2021 | Liang | G11C 16/10 |

* cited by examiner

MEMORY MANAGEMENT OF COMPUTING DEVICES

TECHNICAL FIELD

This disclosure generally relates to memory management of computing devices.

BACKGROUND

A mobile computing device—such as a smartphone, tablet computer, or laptop computer—may include functionality for determining its location, direction, or orientation, such as a GPS receiver, compass, gyroscope, or accelerometer. Such a device may also include functionality for wireless communication, such as BLUETOOTH communication, near-field communication (NFC), or infrared (IR) communication or communication with a wireless local area networks (WLANs) or cellular-telephone network. Such a device may also include one or more cameras, scanners, touchscreens, microphones, or speakers. Mobile computing devices may also execute software applications, such as games, web browsers, or social-networking applications. With social-networking applications, users may connect, communicate, and share information with other users in their social networks.

Mobile computing devices need to be power-efficient and may need to support multiple applications that are active simultaneously. Existing mobile platforms may only have durable memory, which may not be able to be turned off completely when not in use. Additionally, reallocation of memory used by the computing devices is also more difficult as it is not known whether the data currently stored in memory is suitable for release.

SUMMARY OF PARTICULAR EMBODIMENTS

The present disclosure discusses a computing device that support two types of memory—durable memory and discardable memory. An API/library for the operating system of the computing device may be used by applications to request storage of certain types of data in the discardable memory. For example, images (or other types of static content) may be suitable for discardable memory. The computing device, based on memory allocation policies, can reallocate the discardable memory to other applications or turn certain memory banks that include the discardable memory off when an application is inactive. Moreover, rather than swapping the data in discardable memory to disk, which can require a lot of power, the computing device can discard that data stored by the discardable memory and inform the upper layers (e.g., the API/library or application) that the memory for any data that was stored in the discarded memory are now invalid. This memory may then be reallocated. Any data that is completely or partially stored in a reallocated page would be marked as invalid. This notification mechanism allows the upper layers to properly handle invalidated memory.

Innovative aspects of the subject matter described in this specification may be embodied in a method including allocating, by an operating system of a computing device, computer-implemented memory into a discardable portion and a durable portion; receiving, from a computer-executable program, a designation indicator of a particular data file that is associated with the computer-executable program indicating that the particular file is to be stored in the discardable portion of the memory; in response to receiving the designation indictor of the particular data file, storing the particular data file in one or more particular pages of the discardable portion of the memory; identifying an occurrence of a computing condition; in response to identifying the occurrence of the computing condition, marking the one or more particular pages that include the particular data file as invalid for the computer-executable program; receiving, from the computer-executable program, a request for the particular data file; and in response to receiving the request, providing, to the computer-executable program, a notification that the particular data file is invalid for the computer-executable program.

Other embodiments of these aspects include corresponding systems, apparatus, and computer-readable mediums.

These and other embodiments may each optionally include one or more of the following features. For instance, receiving, from the computer-executable program, a designation indicator of an additional data file that is associated with the computer-executable program that the additional data file is to be stored in the durable portion of the memory; in response to receiving the designation indicator of the additional data file, storing the additional data file in one or more additional pages of the durable portion of the memory; in response to identifying the occurrence of the computing condition, maintaining the one or more pages that includes the additional data file as valid for the computer-executable program. The particular data file is an image file, video file, or audio file. A storage size of the particular data file is greater than a threshold size. Identifying the occurrence of the computing condition includes identifying an inactive state of the computer-executable program, and in response, marking the one or more particular pages that includes the particular data file as invalid for the computer-executable program. In response to identifying the inactive state of the computer-executable program, placing the discardable portion of the memory in a power-off state. Identifying the occurrence of the computing condition includes identifying an activation of a further computer-executable program, and in response, marking the one or more particular pages that includes the particular data file as invalid for the computer-executable program, wherein the further computer-executable program has a higher processing priority than the computer-executable program. In response to identifying the activation of the further computer-executable program, reallocating the one or more particular pages of the discardable portion of the memory to one or more additional data files associated with the further computer-executable program.

Storing the particular data file in the one or more particular pages of the discardable portion of the memory includes storing the particular data file in one particular page of the discardable portion of the memory, and wherein marking the one or more particular pages that includes the particular data file as invalid for the computer-executable program includes marking the one particular page that includes the particular data file as invalid for the computer-executable program. The one particular page includes one or more other data files. Storing the particular data file in the one or more particular pages of the discardable portion of the memory includes storing the particular data file in two particular pages of the discardable portion of the memory such that the particular data file straddles the two particular pages, and wherein marking the one or more particular pages that includes the particular data file as invalid for the computer-executable program includes marking the two particular pages that includes the particular data file as invalid for the computer-executable program. The durable portion of the memory includes a page table for the one or more pages of the discardable portion of the memory, wherein marking the one or more particular pages that includes the particular data file as invalid for the computer-executable program includes modifying the page table for the one or more particular pages. The computer-executable program is an augmented reality (AR) or virtual reality (VR) computer-executable program.

The embodiments disclosed herein are only examples, and the scope of this disclosure is not limited to them. Particular embodiments may include all, some, or none of the components, elements, features, functions, operations, or steps of the embodiments disclosed herein. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

DESCRIPTION OF EXAMPLE EMBODIMENTS

Figure 1:
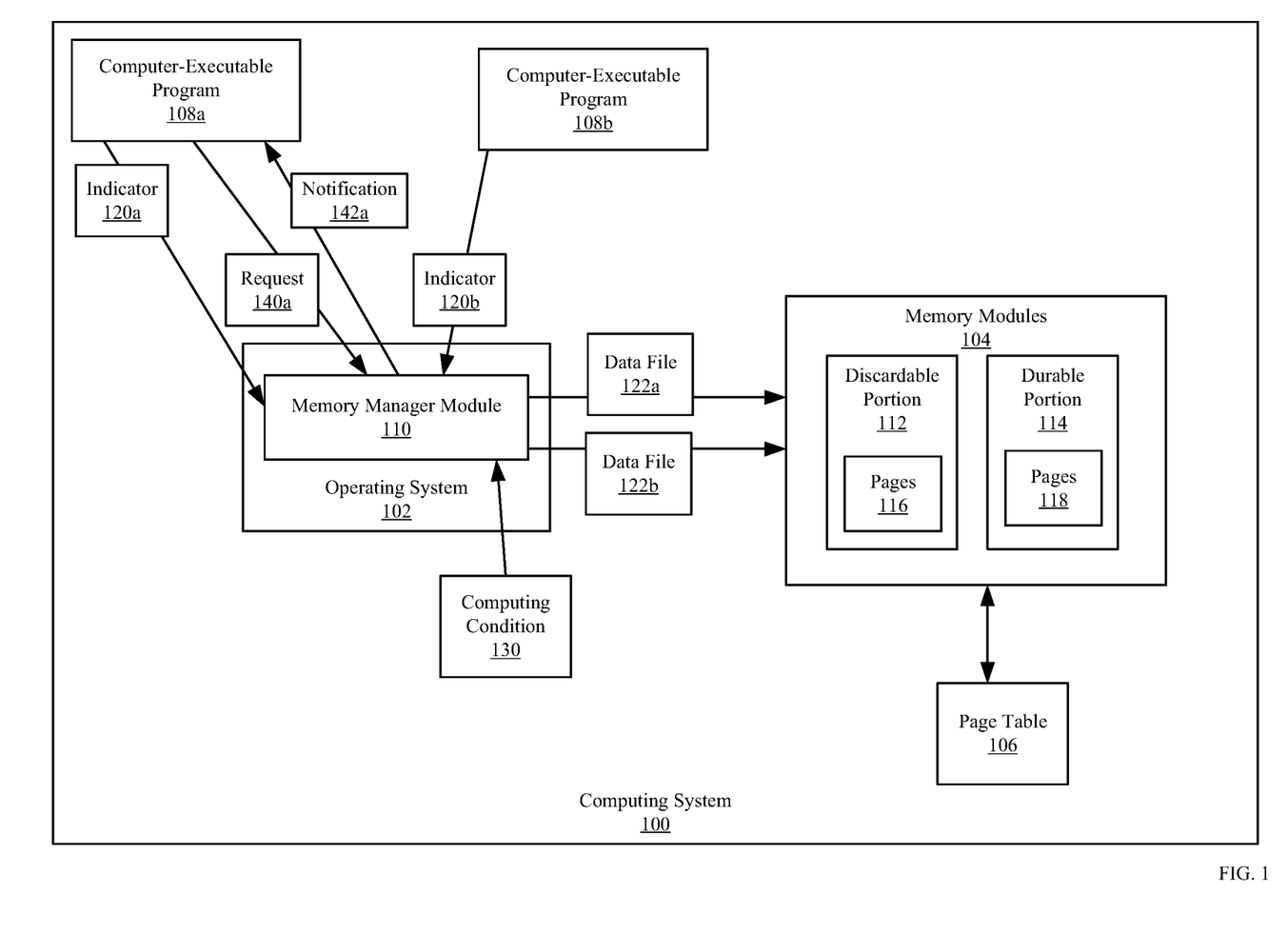
FIG. 1 illustrates an example computing environment for memory management of computing devices.

FIG. 1 illustrates a computing system 100 for memory management of computing devices. The computing system 100 can include an operating system (OS) computing module 102, memory modules (or memory) 104, a page table database 106, and computer-executable program modules 108a, 108b (collectively referred to as computer-executable program modules 108, or computer-executable application modules 108). The OS computing module 102 can include a memory manager computing module 110. The memory modules 104 can include a discardable portion 112 and a durable portion 114.

In some examples, the discardable portion 112 and the durable portion 114 are a logical separation of the memory 104, and are located within the same memory structure (e.g., memory bank). In some examples, the discardable portion 112 and the durable portion 114 are physical separated into differing memory structures (e.g., memory banks).

The OS computing module 102 can allocate the memory modules 104 into the discardable portion 112 and the durable portion 114. Specifically, the OS computing module 102 can allocate the discardable portion 112 of the memory modules 104 such that data that is stored by the discardable portion 112 can be temporary—e.g., such discardable data can be deleted, removed, or otherwise invalidated. The discardable portion 112 can include one or more (memory) pages 116 that can store data that can be reassigned or reallocated by the OS computing module 102 and/or the memory manager computing module 110, described further herein.

Similarly, the OS computing module 102 can allocate the durable portion 114 of the memory modules 104 such that data that is stored by the durable portion 114 can be permanent—e.g., such durable data can be maintained. The durable portion 114 can include one or more (memory) pages 118 that can store data that is to be maintained by the OS computing module 102 and/or the memory manager computing module 110, described further herein.

In some examples, the OS computing module 102 can allocate the memory modules 104 into the discardable portion 112 and the durable portion 114 upon booting of the computing system 100, in response to an event, or in response to a request.

In some examples, the memory modules 104, and in particular, the pages of the memory modules 104, can be associated with an additional attribute of discardable (or durable) to define the discardable portion 112 (and pages 116) and the durable portion 114 (and pages 118). For example, the attributes of the memory modules 104 can include such attributes as read and rewrite, as well as a discardable attribute (and/or durable attribute).

In some examples, the durable portion 114 can include the page table 106 for the pages 116 of the discardable portion 112.

In some examples, the computer-executable program modules 108 can be an augmented reality computer-executable program; a virtual reality (VR) computer-executable program; or a mixed reality computer-executable program.

In some implementations, the memory manager computing module 110 can receive a designation indicator 120a of a data file 122a that is associated with the computer-executable program module 108a indicating that the data file 122a is to be stored in the discardable portion 112 of the memory 104. For example, the computer-executable program module 108a can indicate that the data file 122a is to be stored in the discardable portion 122, e.g., using an API provided to the computer-executable program 108a. In some examples, the data file 122a can include an image file, a video file, or an audio file. In some examples, the storage size of the data file 122a is greater than a threshold size.

In some examples, the memory manger computing module 110 can receive the designation indicator 120a and the data file 122a at substantially the same time from the computer-executable program module 108a (e.g., in one communication cycle). In some examples, the data file 122a includes the designation indicator 120a—i.e., the data file 122a is marked with an attribute (e.g., the designation indicator).

In some implementations, the memory manager computing module 110, in response to receiving the designation indicator 120a of the data file 122a, stores the data file 122a in the pages 116 of the discardable portion 112 of the memory 104. In some examples, the data file 122a is stored within a single page 116 of the discardable portion 112 of the memory 104. In some examples, the data file 122a is stored in two or more pages 116 of the discardable portion 112 of the memory 104.

In some implementations, the memory manager computing module 110 can identify an occurrence of a computing condition 130. In some examples, the memory manager computing module 110 can receive the identification of the computing condition 130 automatically, or in response to a request. For example, the computing condition 130 can include data indicating the occurrence of a computing event, including metadata of such computing event and any relevant data of the computing event. For example, identifying the occurrence of the computing condition 130 can include the memory manager computing module 110 identifying (or receiving an indication of) an inactive state of the computer-executable program module 108a. Specifically, the computer-executable program module 108a can enter a low-power idle mode, or inactive state. In some cases, the computer-executable program module 108a can enter an inactive state when the computer-executable program module 108a has been inactive for greater than a threshold amount of time (e.g., 5 minutes). To that end, the computer-executable program module 108a can provide such notification of the computing condition 130 to the memory manger computing module 108a, or another computing module that monitors the computer-executable program module 108a can provide such notification of the computing condition 130 to the memory manger computing module 108a.

For example, identifying the occurrence of a computing condition can include the memory manager computing module 110 identifying (or receiving an indication of) an activation of a further computer-executable program module. Specifically, the computer-executable program module 108a can have a lower computing priority as compared to a further computer-executable program module, or compared to a newly launched computer-executable program module (the further computer-executable program module having a higher processing priority compared to the computer-executable program module 108a). For example, the further computer-executable program module can be executing in the foreground—e.g., providing a graphical user interface (GUI) element in the foreground of a display interface of the computing system 100; while the computer executable program module 108a can be executing in the background—e.g., providing a GUI element in the background of the display interface of the computing system 100. As a result, the further computer-executable program module can have a higher priority (executing in the foreground) as compared to the computer-executable program module 108a (executing in the background). A computing module that monitors the state of the computer-executable program modules 108 can provide such notification of the computing condition 130 to the memory manger computing module 108a.

In some examples, the memory manager 110 can determine a relative priority of computer-executable program modules 108 based on one or more computing parameters associated with each computer-executable program module 108, and/or a computing state of the computer-executable program modules 108. The memory manager 110 can determine a relative priority of the computer-executable program modules 108 based on a state of the computing system 100, e.g., in view of the computing parameters and/or the computing state of the computer-executable program modules 108.

In some implementations, in response to identifying the occurrence of the computing condition 130, the memory manager computing module 110 can mark the pages 116 that include the data file 122a as invalid for the computer-executable program module 108a. For example, the memory manager computing module 110 can determine that the discardable portion 112 of the memory 104 is to be put in a power-off state, or reallocated for data files of a differing computer-executable program module, described further herein.

In some examples, when the occurrence of the computing condition 130 includes an inactive state of the computer-executable program module 108a, the memory manager computing module 110 can mark one or more of the pages 116 that includes the data file 122a as invalid for the computer-executable program module 108a. Specifically, the memory manager computing module 110 can, in response to identifying the inactive state of the computer-executable program module 108a, change a power state of the discardable portion 112 of the memory 104 to an "off-state," a "power-off state," or a "low-power state." The memory manager computing module 110 can invalidate the data file 122a as it is stored by the discardable portion 112 of the memory 104. In some examples, the memory manager computing module 110 invalidates the data file 122a as it is stored by the discardable portion 112 of the memory 104 (in response to the computing condition 130) independent of action by the computer-executable program module 108a. That is, in some examples, the computer-executable program module 108a does not have any control in regard to the computing condition 130 and/or invalidation of the data file 122a for the computer-executable program module 108a as it is stored by the discardable portion 112 of the memory 104.

In some examples, when the occurrence of the computing condition 130 includes identifying an activation of the further computer-executable program, the memory manager computing module 110 can mark one or more pages 116 that includes the data file 122a as invalid for the computer-executable program module 108a. Specifically, the memory manager computing module 110 can, in response to identifying the activation of the further computer-executable program module, reallocate the one or more pages 116 that includes the data file 122a to additional data files associated with the further computer-executable program module. That is, the memory manager computing module 110 can invalidate the data file 122a, and reallocate the pages 116 of the discardable portion 112 of the memory 104 to the further computer-executable program module. In some examples, the memory manager computing module 110 invalidates the data file 122a as it is stored by the discardable portion 112 of the memory 104 (in response to the computing condition 130) and reallocates the pages 116 to the further computer-executable program module independent of action by the computer-executable program module 108a. That is, in some examples, the computer-executable program module 108a does not have any control in regard to the computing condition 130 and/or invalidation of the data file 122a for the computer-executable program module 108a as it is stored by the discardable portion 112 of the memory 104 and/or reallocation of the pages 116 to the further computer-executable program module.

In some examples, as mentioned earlier, the data file 122a can be stored in one particular page 116 of the discardable portion 112 of the memory 104. To that end, the memory manager computing module 110 can mark the one particular page 116 that includes the data file 122a as invalid for the computer-executable program module 108a. That is, the data file 122a is page aligned with the single page 116, and the memory manager computing module 110 invalidates the single page 116. In some cases, the one particular page 116 can include the data file 122a and an additional data file or a portion of an additional data file (associated with the computer-executable program module 108a or another computer-executable program module). To that end, both of the data files (the data file 122a and the additional data file) are marked as invalid by the memory manager computing module 110.

In some examples, as mentioned earlier, the data file 122a can be stored in two particular pages 116 of the discardable portion 112 of the memory 104. To that end, the memory manager computing module 110 can mark the two particular pages 116 that includes the data file 122a as invalid for the computer-executable program module 108a. That is, the data file 122a can straddle two pages 116, and the memory manager computing module 110 invalidates both of the pages 116. In some cases, one or both of the two pages 116 can include the data file 122a and an additional data file or a portion of an additional data file (associated with the computer-executable program module 108a or another computer-executable program module). To that end, both of the data files (the data file 122a and the additional data file) are marked as invalid by the memory manager computing module 110.

In some examples, as mentioned earlier, the durable portion 114 of the memory 104 can include the page table 106 for the pages 116 of the discardable portion 112 of the memory 104. To that end, when the memory manager computing module 110 marks the particular pages 116 that include the data file 122a as invalid for the computer-executable program module 108a, the memory manger computing module 110 can modify the page table 106 for the particular pages 116. For example, the memory manager computing module 110 can modify the page table 106 to remove the entry that is associated with the particular page(s) 116 that included the data file 122a, or invalidate such entry.

In some implementations, at a later time, the memory manager computing module 110 can receive a request 140a from the computer-executable program module 108a for the data file 122a. In response to the request 140a, the memory manager computing module 110a can provide, to the computer-executable program module 108a, a notification 142a that indicates that the data file 122a is invalid for the computer-executable program module 108a. That is, the notification 142a can be a signal provided to the computer-executable program module 108a indicating that the page(s) 116 that include the data file 122a are now invalid—the memory allocation is no longer valid.

In some implementations, the memory manager computing module 110 can receive a designation indicator 120b of a data file 122b that is associated with the computer-executable program module 108b indicating that the data file 122b is to be stored in the durable portion 114 of the memory 104. For example, the computer-executable program module 108b can indicate that the data file 122b is to be stored in the durable portion 114 of the memory 104, e.g., using an API provided to the computer-executable program 108b. In some examples, the data file 122b can include an image file, a video file, or an audio file. In some examples, the memory manger computing module 110 can receive the designation indicator 120b and the data file 122b at substantially the same time from the computer-executable program module 108b (e.g., in one communication cycle). In some examples, the data file 122b includes the designation indicator 120b—i.e., the data file 122b is marked with an attribute (e.g., the designation indicator).

In some implementations, the memory manager computing module 110, in response to receiving the designation indicator 120b of the data file 122b, stores the data file 122b in the pages 118 of the durable portion 114 of the memory 104. In some examples, the data file 122b is stored within a single page 118 of the durable portion 114 of the memory 104. In some examples, the data file 122b is stored in two or more pages 118 of the durable portion 114 of the memory 104. As mentioned above, the memory manager computing module 110 can identify the occurrence of a computing condition 130. For example, identifying the occurrence of the computing condition 130 can include the memory manager computing module 110 identifying (or receiving an indication of) an inactive state of the computer-executable program module 108a. For example, identifying the occurrence of a computing condition 130 can include the memory manager 110 identifying (or receiving an indication of) an activation of a further computer-executable program module.

In some implementations, in response to identifying the occurrence of the computing condition 130, the memory manager computing module 110 can maintain the pages 118 that include the data file 122b as valid for the computer-executable program module 108b. That is, as the data file 122b is maintained in the pages 118 that are in the durable portion 114 of the memory 104, the occurrence of the computing condition 130 does not affect the data file 122b (e.g., the storage of the data file 122b).

Figure 2:
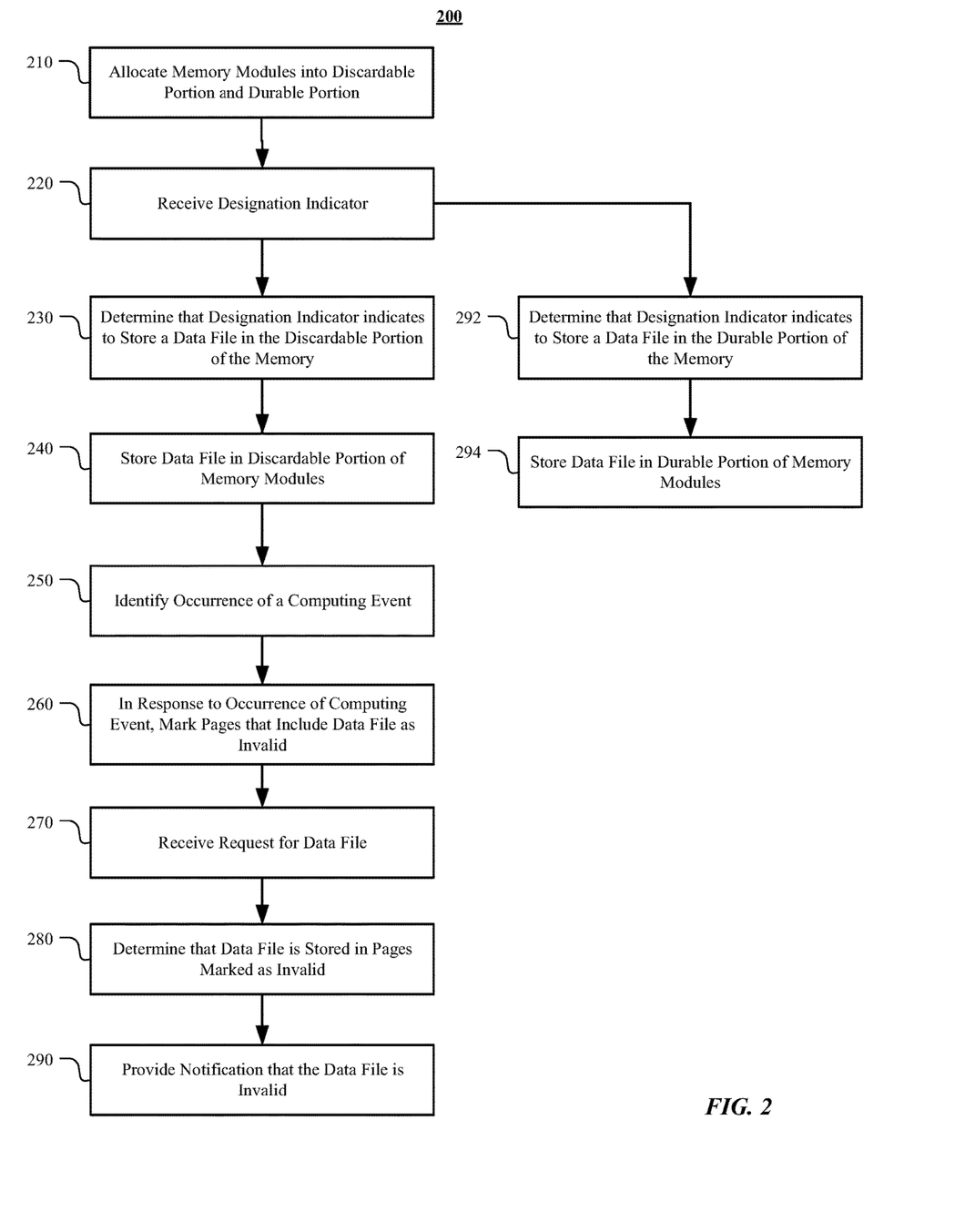
FIG. 2 illustrates an example flowchart for memory management of computing devices.

FIG. 2 illustrates an example method 200 for memory management of computing devices. The method may begin at step 210, where the OS computing module 102 can allocate the memory modules 104 into the discardable portion 112 and the durable portion 114. At step 220, the memory manager computing module 110 can receive the designation indicator 120a of the data file 122a that is associated with the computer-executable program module 108a. At step 230, the memory manager computing module 110 determines that the designation indicator 120a indicates to store the data file 122a in the discardable portion 112 of the memory 104. At step 240, the memory manager computing module 110 stores the data file 122a in the pages 116 of the discardable portion 112 of the memory 104. At step 250, the memory manager computing module 110 can identify the occurrence of the computing condition 130. At step 260, in response to identifying the occurrence of the computing condition 130, the memory manager computing module 110 can mark the pages 116 that include the data file 122a as invalid for the computer-executable program module 108a. At step 270, the memory manager computing module 110 can receive the request 140a from the computer-executable program module 108a for the data file 122a. At step 280, the memory manager computing module 110 can determine that the data file 122a is stored in pages marked as invalid. At step 290, the memory manager computing module 110a can provide, to the computer-executable program module 108a, the notification 142a that indicates that the data file 122a is invalid for the computer-executable program module 108a.

At step 292, the memory manager computing module 110 determines that the designation indicator 120b indicates to store the data file 122a in the durable portion 114 of the memory 104. At step 294, the memory manager computing module 110, in response to receiving the designation indicator 120b of the data file 122b, stores the data file 122b in the pages 118 of the durable portion 114 of the memory 104.

Particular embodiments may repeat one or more steps of the method of FIG. 2, where appropriate. Although this disclosure describes and illustrates particular steps of the method of FIG. 2 as occurring in a particular order, this disclosure contemplates any suitable steps of the method of FIG. 2 occurring in any suitable order. Moreover, although this disclosure describes and illustrates an example method for memory management of computing devices including the particular steps of the method of FIG. 2, this disclosure contemplates any suitable method for memory management of computing devices including any suitable steps, which may include all, some, or none of the steps of the method of FIG. 2, where appropriate. Furthermore, although this disclosure describes and illustrates particular components, devices, or systems carrying out particular steps of the method of FIG. 2, this disclosure contemplates any suitable combination of any suitable components, devices, or systems carrying out any suitable steps of the method of FIG. 2.

Figure 3:
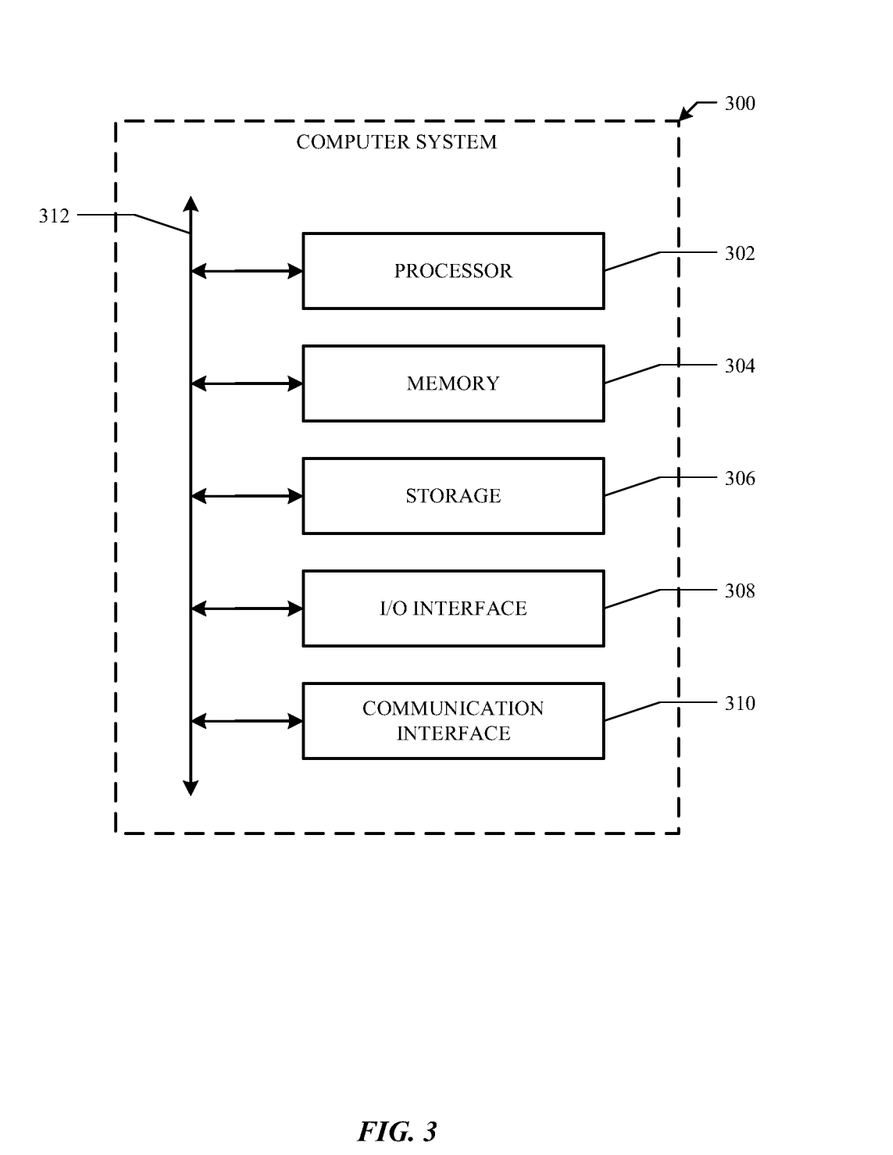
FIG. 3 illustrates an example computer system.

FIG. 3 illustrates an example computer system 300. In particular embodiments, one or more computer systems 300 perform one or more steps of one or more methods described or illustrated herein. In particular embodiments, one or more computer systems 300 provide functionality described or illustrated herein. In particular embodiments, software running on one or more computer systems 300 performs one or more steps of one or more methods described or illustrated herein or provides functionality described or illustrated herein. Particular embodiments include one or more portions of one or more computer systems 300. Herein, reference to a computer system may encompass a computing device, and vice versa, where appropriate. Moreover, reference to a computer system may encompass one or more computer systems, where appropriate.

This disclosure contemplates any suitable number of computer systems 300. This disclosure contemplates computer system 300 taking any suitable physical form. As example and not by way of limitation, computer system 300 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 300 may include one or more computer systems 300; be unitary or distributed; span multiple locations; span multiple machines; span multiple data centers; or reside in a cloud, which may include one or more cloud components in one or more networks. Where appropriate, one or more computer systems 300 may perform without substantial spatial or temporal limitation one or more steps of one or more methods described or illustrated herein. As an example and not by way of limitation, one or more computer systems 300 may perform in real time or in batch mode one or more steps of one or more methods described or illustrated herein. One or more computer systems 300 may perform at different times or at different locations one or more steps of one or more methods described or illustrated herein, where appropriate.

In particular embodiments, computer system 300 includes a processor 302, memory 304, storage 306, an input/output (I/O) interface 308, a communication interface 310, and a bus 312. Although this disclosure describes and illustrates a particular computer system having a particular number of particular components in a particular arrangement, this disclosure contemplates any suitable computer system having any suitable number of any suitable components in any suitable arrangement.

In particular embodiments, processor 302 includes hardware for executing instructions, such as those making up a computer program. As an example and not by way of limitation, to execute instructions, processor 302 may retrieve (or fetch) the instructions from an internal register, an internal cache, memory 304, or storage 306; decode and execute them; and then write one or more results to an internal register, an internal cache, memory 304, or storage 306. In particular embodiments, processor 302 may include one or more internal caches for data, instructions, or addresses. This disclosure contemplates processor 302 including any suitable number of any suitable internal caches, where appropriate. As an example and not by way of limitation, processor 302 may include one or more instruction caches, one or more data caches, and one or more translation lookaside buffers (TLBs). Instructions in the instruction caches may be copies of instructions in memory 304 or storage 306, and the instruction caches may speed up retrieval of those instructions by processor 302. Data in the data caches may be copies of data in memory 304 or storage 306 for instructions executing at processor 302 to operate on; the results of previous instructions executed at processor 302 for access by subsequent instructions executing at processor 302 or for writing to memory 304 or storage 306; or other suitable data. The data caches may speed up read or write operations by processor 302. The TLBs may speed up virtual-address translation for processor 302. In particular embodiments, processor 302 may include one or more internal registers for data, instructions, or addresses. This disclosure contemplates processor 302 including any suitable number of any suitable internal registers, where appropriate. Where appropriate, processor 302 may include one or more arithmetic logic units (ALUs); be a multi-core processor; or include one or more processors 302. Although this disclosure describes and illustrates a particular processor, this disclosure contemplates any suitable processor.

In particular embodiments, memory 304 includes main memory for storing instructions for processor 302 to execute or data for processor 302 to operate on. As an example and not by way of limitation, computer system 300 may load instructions from storage 306 or another source (such as, for example, another computer system 300) to memory 304. Processor 302 may then load the instructions from memory 304 to an internal register or internal cache. To execute the instructions, processor 302 may retrieve the instructions from the internal register or internal cache and decode them. During or after execution of the instructions, processor 302 may write one or more results (which may be intermediate or final results) to the internal register or internal cache. Processor 302 may then write one or more of those results to memory 304. In particular embodiments, processor 302 executes only instructions in one or more internal registers or internal caches or in memory 304 (as opposed to storage 306 or elsewhere) and operates only on data in one or more internal registers or internal caches or in memory 304 (as opposed to storage 306 or elsewhere). One or more memory buses (which may each include an address bus and a data bus) may couple processor 302 to memory 304. Bus 312 may include one or more memory buses, as described below. In particular embodiments, one or more memory management units (MMUs) reside between processor 302 and memory 304 and facilitate accesses to memory 304 requested by processor 302. In particular embodiments, memory 304 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 304 may include one or more memories 304, where appropriate. Although this disclosure describes and illustrates particular memory, this disclosure contemplates any suitable memory.

In particular embodiments, storage 306 includes mass storage for data or instructions. As an example and not by way of limitation, storage 306 may include a hard disk drive (HDD), a floppy disk drive, flash memory, an optical disc, a magneto-optical disc, magnetic tape, or a Universal Serial Bus (USB) drive or a combination of two or more of these. Storage 306 may include removable or non-removable (or fixed) media, where appropriate. Storage 306 may be internal or external to computer system 300, where appropriate. In particular embodiments, storage 306 is non-volatile, solid-state memory. In particular embodiments, storage 306 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 306 taking any suitable physical form. Storage 306 may include one or more storage control units facilitating communication between processor 302 and storage 306, where appropriate. Where appropriate, storage 306 may include one or more storages 306. Although this disclosure describes and illustrates particular storage, this disclosure contemplates any suitable storage.

In particular embodiments, I/O interface 308 includes hardware, software, or both, providing one or more interfaces for communication between computer system 300 and one or more I/O devices. Computer system 300 may include one or more of these I/O devices, where appropriate. One or more of these I/O devices may enable communication between a person and computer system 300. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 308 for them. Where appropriate, I/O interface 308 may include one or more device or software drivers enabling processor 302 to drive one or more of these I/O devices. I/O interface 308 may include one or more I/O interfaces 308, where appropriate. Although this disclosure describes and illustrates a particular I/O interface, this disclosure contemplates any suitable I/O interface.

In particular embodiments, communication interface 310 includes hardware, software, or both providing one or more interfaces for communication (such as, for example, packet-based communication) between computer system 300 and one or more other computer systems 300 or one or more networks. As an example and not by way of limitation, communication interface 310 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 310 for it. As an example and not by way of limitation, computer system 300 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 300 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 300 may include any suitable communication interface 310 for any of these networks, where appropriate. Communication interface 310 may include one or more communication interfaces 310, where appropriate. Although this disclosure describes and illustrates a particular communication interface, this disclosure contemplates any suitable communication interface.

In particular embodiments, bus 312 includes hardware, software, or both coupling components of computer system 300 to each other. As an example and not by way of limitation, bus 312 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 312 may include one or more buses 312, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A computer-implemented method, comprising:
    allocating, by an operating system of a computing device, computer-implemented memory into a discardable portion and a durable portion, wherein the discardable portion and the durable portion are physical separated into differing memory structures;
    receiving, from a computer-executable program, a designation indicator of a particular data file that is associated with the computer-executable program indicating that the particular data file is to be stored in the discardable portion of the memory;
    in response to receiving the designation indicator of the particular data file, storing the particular data file in one or more particular pages of the discardable portion of the memory wherein the durable portion of the memory includes a page table for the one or more particular pages of the discardable portion of the memory;
    identifying a further computer-executable program that requires at least one of the one or more particular pages of the discardable portion of the memory to be overwritten or powered off;
    in response to identifying the further computer-executable program, marking the one or more particular pages that include the particular data file as invalid for the computer-executable program, including modifying the page table for the one or more particular pages;
    receiving, from the computer-executable program, a request for the particular data file;
    and in response to receiving the request, providing, to the computer-executable program, a notification that the particular data file is invalid for the computer-executable program.

2. The computer-implemented method of claim 1, further comprising:
    receiving, from the computer-executable program, a designation indicator of an additional data file that is associated with the computer-executable program that the additional data file is to be stored in the durable portion of the memory;
    in response to receiving the designation indicator of the additional data file, storing the additional data file in one or more additional pages of the durable portion of the memory; and
    in response to identifying an occurrence of a computing condition, maintaining the one or more additional pages that includes the additional data file as valid for the computer-executable program.

3. The computer-implemented method of claim 1, wherein the particular data file is an image file, video file, or audio file.

4. The computer-implemented method of claim 1, wherein a storage size of the particular data file is greater than a threshold size.

5. The computer-implemented method of claim 1, wherein identifying the further computer-executable program that requires at least one of the one or more particular pages of the discardable portion of the memory to be overwritten or powered off further includes identifying an activation of the further computer-executable program, and in response, marking the one or more particular pages that includes the particular data file as invalid for the computer-executable program, wherein the further computer-executable program has a higher processing priority than the computer-executable program.

6. The computer-implemented method of claim 5, further comprising, in response to identifying the activation of the further computer-executable program, reallocating the one or more particular pages of the discardable portion of the memory to one or more additional data files associated with the further computer-executable program.

7. The computer-implemented method of claim 1, wherein storing the particular data file in the one or more particular pages of the discardable portion of the memory includes storing the particular data file in one particular page of the discardable portion of the memory, and wherein marking the one or more particular pages that includes the particular data file as invalid for the computer-executable program includes marking the one particular page that includes the particular data file as invalid for the computer-executable program.

8. The computer-implemented method of claim 7, wherein the one particular page includes one or more other data files.

9. The computer-implemented method of claim 1, wherein storing the particular data file in the one or more particular pages of the discardable portion of the memory includes storing the particular data file in two particular pages of the discardable portion of the memory such that the particular data file straddles the two particular pages, and wherein marking the one or more particular pages that includes the particular data file as invalid for the computer-executable program includes marking the two particular pages that includes the particular data file as invalid for the computer-executable program.

10. The computer-implemented method of claim 1, wherein the computer-executable program is an augmented reality (AR) or virtual reality (VR) computer-executable program.

11. A system comprising a processor having access to memory media storing instructions executable by the processor to:
    allocate, by an operating system of a computing device, computer-implemented memory into a discardable portion and a durable portion, wherein the discardable portion and the durable portion are physical separated into differing memory structures;
    receive, from a computer-executable program, a designation indicator of a particular data file that is associated with the computer-executable program indicating that the particular data file is to be stored in the discardable portion of the memory;
    in response to receiving the designation indicator of the particular data file, store the particular data file in one or more particular pages of the discardable portion of the memory wherein the durable portion of the memory includes a page table for the one or more particular pages of the discardable portion of the memory;

identify a further computer-executable program that requires at least one of the one or more particular pages of the discardable portion of the memory to be overwritten or powered off;

in response to identifying the further computer-executable program, mark the one or more particular pages that include the particular data file as invalid for the computer-executable program, including modifying the page table for the one or more particular pages;

receive, from the computer-executable program, a request for the particular data file;

and in response to receiving the request, provide, to the computer-executable program, a notification that the particular data file is invalid for the computer-executable program.

12. The system of claim 11, the instructions further comprising:

receive, from the computer-executable program, a designation indicator of an additional data file that is associated with the computer-executable program that the additional data file is to be stored in the durable portion of the memory;

in response to receiving the designation indicator of the additional data file, store the additional data file in one or more additional pages of the durable portion of the memory; and in response to identifying an occurrence of a computing condition, maintain the one or more additional pages that includes the additional data file as valid for the computer-executable program.

13. The system of claim 11, wherein the particular data file is an image file, video file, or audio file.

14. The system of claim 11, wherein a storage size of the particular data file is greater than a threshold size.

15. A non-transitory computer-readable medium storing software comprising instructions executable by one or more computers which, upon such execution, cause the one or more computers to perform operations comprising:

allocate, by an operating system of a computing device, computer-implemented memory into a discardable portion and a durable portion, wherein the discardable portion and the durable portion are physical separated into differing memory structures;

receive, from a computer-executable program, a designation indicator of a particular data file that is associated with the computer-executable program indicating that the particular data file is to be stored in the discardable portion of the memory;

in response to receiving the designation indicator of the particular data file, store the particular data file in one or more particular pages of the discardable portion of the memory wherein the durable portion of the memory includes a page table for the one or more particular pages of the discardable portion of the memory;

identify a further computer-executable program that requires at least one of the one or more particular pages of the discardable portion of the memory to be overwritten or powered off;

in response to identifying the further computer-executable program, mark the one or more particular pages that include the particular data file as invalid for the computer-executable program, including modifying the page table for the one or more particular pages;

receive, from the computer-executable program, a request for the particular data file;

and in response to receiving the request, provide, to the computer-executable program, a notification that the particular data file is invalid for the computer-executable program.

* * * * *